(12) United States Patent
Pulford et al.

(10) Patent No.: US 10,792,960 B2
(45) Date of Patent: Oct. 6, 2020

(54) ARTICLE WITH ELECTRONIC COMPONENT INCLUSION

(71) Applicant: The Goodyear Tire & Rubber Company, Akron, OH (US)

(72) Inventors: Carl Trevor Ross Pulford, Akron, OH (US); Michael Chris Varley, Cleveland Heights, OH (US); Justin Yinket Che, Akron, OH (US); Cheng-Hsiung Lin, Hudson, OH (US)

(73) Assignee: The Goodyear Tire & Rubber Company, Akron, OH (US)

( * ) Notice: Subject to any disclaimer, the term of this patent is extended or adjusted under 35 U.S.C. 154(b) by 97 days.

(21) Appl. No.: 16/182,869

(22) Filed: Nov. 7, 2018

(65) Prior Publication Data

US 2019/0184771 A1 Jun. 20, 2019

Related U.S. Application Data

(60) Provisional application No. 62/608,123, filed on Dec. 20, 2017.

(51) Int. Cl.
*B60C 23/04* (2006.01)
*G01M 17/02* (2006.01)
(Continued)

(52) U.S. Cl.
CPC .......... *B60C 23/04* (2013.01); *B29D 30/0061* (2013.01); *B60C 23/20* (2013.01);
(Continued)

(58) Field of Classification Search
CPC .. G01M 17/02; G01M 17/021; G01M 17/022; G01M 17/027; G01M 17/025; G01M 17/024; G01M 17/10; G01M 7/08; G01M 17/0076; G01M 17/013; G01M 17/03; G01M 17/04; G01M 17/06;
(Continued)

(56) References Cited

U.S. PATENT DOCUMENTS 4,695,823 A 9/1987 Vernon
4,911,217 A 3/1990 Dunn
(Continued)

FOREIGN PATENT DOCUMENTS

WO WO2016144944 A1 9/2016
WO WO2016145309 A1 9/2016

OTHER PUBLICATIONS

Seo, et al., Wirelesss Recording in the Peripheral Nervous System with Ultrasonic Neural Dust. NeuroResource, Aug. 3, 2016, pp. 529 through 539, Neuron 91, CellPress.

*Primary Examiner* — Andre J Allen
(74) *Attorney, Agent, or Firm* — Edward T. Kennedy

(57) ABSTRACT

An article that experiences repeated deformation includes an electronic component as an inclusion. The article includes at least one structural element, in which the structural element includes a material. At least one electronic component is incorporated into the material as an inclusion. The electronic component includes an integrated circuit and may also include at least one sensor and an antenna. The size of the electronic inclusion is no greater than the largest inclusion typically occurring within the material. The article may be an article formed of rubber, such as a tire.

19 Claims, 3 Drawing Sheets

(51) Int. Cl.
*H05K 5/06* (2006.01)
*H05K 7/02* (2006.01)
*B60C 23/20* (2006.01)
*B29D 30/00* (2006.01)
*B60C 19/00* (2006.01)

(52) U.S. Cl.
CPC ............ *G01M 17/02* (2013.01); *H05K 5/065* (2013.01); *H05K 7/02* (2013.01); *B29D 2030/0077* (2013.01); *B29D 2030/0083* (2013.01); *B60C 2019/004* (2013.01)

(58) Field of Classification Search
CPC ........ G01M 17/08; G01M 1/02; G01M 1/045; G01M 1/12; G01M 1/225; G01M 3/40; G01M 5/0091; G01M 7/02; G01M 99/00; G01M 99/002; B60C 23/0494; B60C 2019/004; B60C 23/0493; B60C 19/00; B60C 23/04; B60C 23/0498; B60C 23/064; B60C 23/0488; B60C 23/0496; B60C 23/0408; B60C 23/041; B60C 23/0411; B60C 23/20; B60C 23/0486; B60C 23/06; B60C 11/243; B60C 11/246; B60C 23/061; B60C 99/00; B60C 11/0083; B60C 13/003; B60C 2009/2038; B60C 23/00; B60C 23/003; B60C 23/004; B60C 23/02; B60C 23/0401; B60C 23/0406; B60C 23/0416; B60C 23/043; B60C 23/0455; B60C 23/0459; B60C 23/0474; B60C 23/0489; B60C 23/0491; B60C 25/002; B60C 25/005; B60C 25/007; B60C 29/02; B60C 3/04; B60C 99/006; B60C 11/0332; B60C 11/24; B60C 13/001; B60C 13/02; B60C 15/0036; B60C 17/02; B60C 2009/0071; B60C 2009/2022; B60C 2200/02; B60C 2200/06; B60C 2200/065; B60C 23/001; B60C 23/007; B60C 23/008; B60C 23/0413; B60C 23/0427; B60C 23/0447; B60C 23/0454; B60C 23/0457; B60C 23/0462; B60C 23/0467; B60C 23/0471; B60C 23/0472; B60C 23/0476; B60C 23/0479; B60C 23/0484; B60C 23/065; B60C 23/066; B60C 23/10; B60C 25/0548; B60C 25/056; B60C 25/132; B60C 25/138; B60C 25/18; B60C 29/005; B60C 9/005; B60C 9/18; B60C 9/1807; B60C 9/20; B60C 9/28; G01L 17/00; G01L 17/005; G01L 19/0645; G01L 19/147; G01L 1/16; G01L 1/18; G01L 7/187; G01L 9/0052; G01L 9/008
USPC .................................................. 73/146–146.8
See application file for complete search history.

(56) References Cited

U.S. PATENT DOCUMENTS

| | | | |
|---|---|---|---|
| 5,181,975 | A | 1/1993 | Pollack |
| 5,218,861 | A | 6/1993 | Brown et al. |
| 5,348,067 | A | 9/1994 | Myatt |
| 5,520,231 | A | 5/1996 | Myatt |
| 7,832,263 | B2 | 11/2010 | Rensel et al. |
| 8,072,336 | B2 | 12/2011 | Uehara et al. |
| 2005/0076982 | A1* | 4/2005 | Metcalf ............... B60C 23/0493 152/152.1 |
| 2006/0185429 | A1 | 8/2006 | Liu et al. |
| 2008/0264160 | A1 | 10/2008 | Nornes et al. |
| 2008/0297337 | A1 | 12/2008 | Marguet et al. |
| 2009/0277262 | A1* | 11/2009 | Rensel ................... B60C 23/20 73/146 |
| 2011/0163737 | A1 | 7/2011 | Nornes et al. |
| 2016/0025531 | A1* | 1/2016 | Bischoff ................. G01L 1/146 73/861.73 |
| 2016/0039253 | A1 | 2/2016 | Wagner et al. |
| 2016/0039254 | A1 | 2/2016 | Wagner et al. |
| 2016/0290880 | A1 | 10/2016 | Lewis et al. |

* cited by examiner

ARTICLE WITH ELECTRONIC COMPONENT INCLUSION

FIELD OF THE INVENTION

The invention relates to articles that experience repeated deformation, such as tires. More particularly, the invention relates to electronic components that sense various conditions within an article that experiences deformation. Specifically, the invention is directed to an article that includes an electronic component that is incorporated into the material of a structure of the article as an inclusion.

BACKGROUND OF THE INVENTION

Many articles, such as tires, experience repeated deformation. For example, articles that experience repeated deformation include any type of tires, such as pneumatic tires, non-pneumatic tires, automotive tires, passenger tires, truck tires, commercial tires, off-the-road tires, aircraft tires, spacecraft tires, and the like, as well as buildings, bridges, shoe soles, medical devices, rubber engineered products such as air springs and vibration mounts, bearings, sealants, adhesives, and the like. Reference herein is made to a pneumatic tire by way of example, with the understanding that the invention applies to any article that experiences repeated deformation.

In the manufacture of a pneumatic tire, the tire is typically built on the drum of a tire-building machine, which is known in the art as a tire building drum. Numerous tire components are wrapped about and/or applied to the drum in sequence, forming a cylindrical-shaped tire carcass. The tire carcass is then expanded into a toroidal shape for receipt of the remaining components of the tire, such as a belt package and a rubber tread. The completed toroidally-shaped unvulcanized tire carcass, which is known in the art at that stage as a green tire, is then inserted into a mold or press for forming of the tread pattern and curing or vulcanization.

Each of the tire components is made of a material that includes an elastomer compound, and certain components may be reinforced with other materials depending on specific design and performance requirements. For example, the belt package includes layers of strips of rubber that are reinforced with cords, and the tread is typically an elastomer compound that may be reinforced with particulate materials.

For many modern tires, it is often desirable to mount electronic components to the tires either before or after curing. Such electronic components enable the temperature, pressure and/or other parameters of the tire to be continuously monitored during vehicle operation. All modern electronic components include an integrated circuit that processes and stores information. One or more sensors are integrated with or electronically connected to the integrated circuit. An antenna for receiving and transmitting a signal to an external reader is also electronically connected to the integrated circuit, and may be carried on a substrate with the integrated circuit.

In the prior art, such electronic components have typically been attached to the inside surface of a pneumatic tire, which defines the cavity containing the inflation gas. Such a location has enabled the electronic components to continuously sense parameters such as the temperature and pressure inside the tire cavity, while not interfering with the structure of the tire. More particularly, prior art electronic component units for tires have typically been about 5 to 10 millimeters (mm) thick by about 20 to 25 mm in diameter. Because the integrity of the tire components is important, the size of prior art electronic component units has dictated placement on the inside surface of the pneumatic tire, and thus inside the tire cavity.

While prior art electronic component units are acceptable for many uses, it is desirable to monitor the actual temperature and other parameters at specific structural locations inside the tire structure during use on a vehicle or on a dynamic tire testing apparatus. For example, monitoring the actual temperature at the edge of the belts in the belt package would be advantageous in predicting ongoing tire performance and potential tire replacement, as well as in providing immediate information to a driver or dispatcher to adjust the speed of a vehicle before potential thermal damage to the tire may occur. However, accurate measurement of the actual temperature at such a location requires the electronic component unit to be permanently embedded into the tire interior structure. Due to the size of prior art electronic component units, any permanent embedding of such units into the tire interior structure may undesirably impair the structure of the tire by potentially creating stress risers, which may compromise the fatigue resistance of the tire.

Other prior art techniques of measuring the interior temperature of tires at specific locations has included inserting needle-like temperature-measuring probes into the structure of the tire until the tip of the probe reaches the desired location. Such prior art techniques are not suitable for monitoring temperature during tire use, since the tire has to be stationary while the needle is inserted and removed.

As a result, it is desirable to develop an article, such as a tire, which includes an electronic component that is integrated into the structure of the article without adversely affecting the performance or life of the article.

SUMMARY OF THE INVENTION

According to an aspect of an exemplary embodiment of the invention, an article with an electronic component inclusion is provided. The article includes at least one structural element, in which the structural element includes a material. At least one electronic component is incorporated into the material as an inclusion, and the electronic component includes an integrated circuit.

Definitions

"Axial" and "axially" mean lines or directions that are parallel to the axis of rotation of the tire.

"Axially inward" and "axially inwardly" refer to an axial direction that is toward the axial center of the tire.

"Axially outward" and "axially outwardly" refer to an axial direction that is away from the axial center of the tire.

"Bead" means that part of the tire comprising an annular tensile member wrapped by ply cords and shaped, with or without other reinforcement elements such as flippers, chippers, apexes, toe guards and chafers, to fit the design rim.

"Carcass" means the tire structure apart from the belt structure, tread, undertread, and sidewall rubber over the plies, but including the beads.

"Circumferential" means lines or directions extending along the perimeter of the surface of the annular tread perpendicular to the axial direction.

"Cord" means one of the reinforcement strands of which the plies in the tire are comprised.

"Equatorial plane (EP)" means the plane perpendicular to the tire's axis of rotation and passing through the center of its tread.

"Innerliner" means the layer or layers of elastomer or other material that form the inside surface of a tubeless tire and that contain the inflating fluid within the tire.

"Radial" and "radially" mean lines or directions that are perpendicular to the axis of rotation of the tire.

"Radially inward" and "radially inwardly" refer to a radial direction that is toward the central axis of rotation of the tire.

"Radially outward" and "radially outwardly" refer to a radial direction that is away from the central axis of rotation of the tire.

"Radial-ply tire" means a belted or circumferentially-restricted pneumatic tire in which the ply cords which extend from bead to bead are laid at cord angles between about 65 to about 90 degrees with respect to the equatorial plane of the tire.

BRIEF DESCRIPTION OF DRAWINGS

The invention will be described by way of example and with reference to the accompanying drawings, in which.

Similar numerals refer to similar parts throughout the drawings.

DETAILED DESCRIPTION OF THE INVENTION

Figure 1:
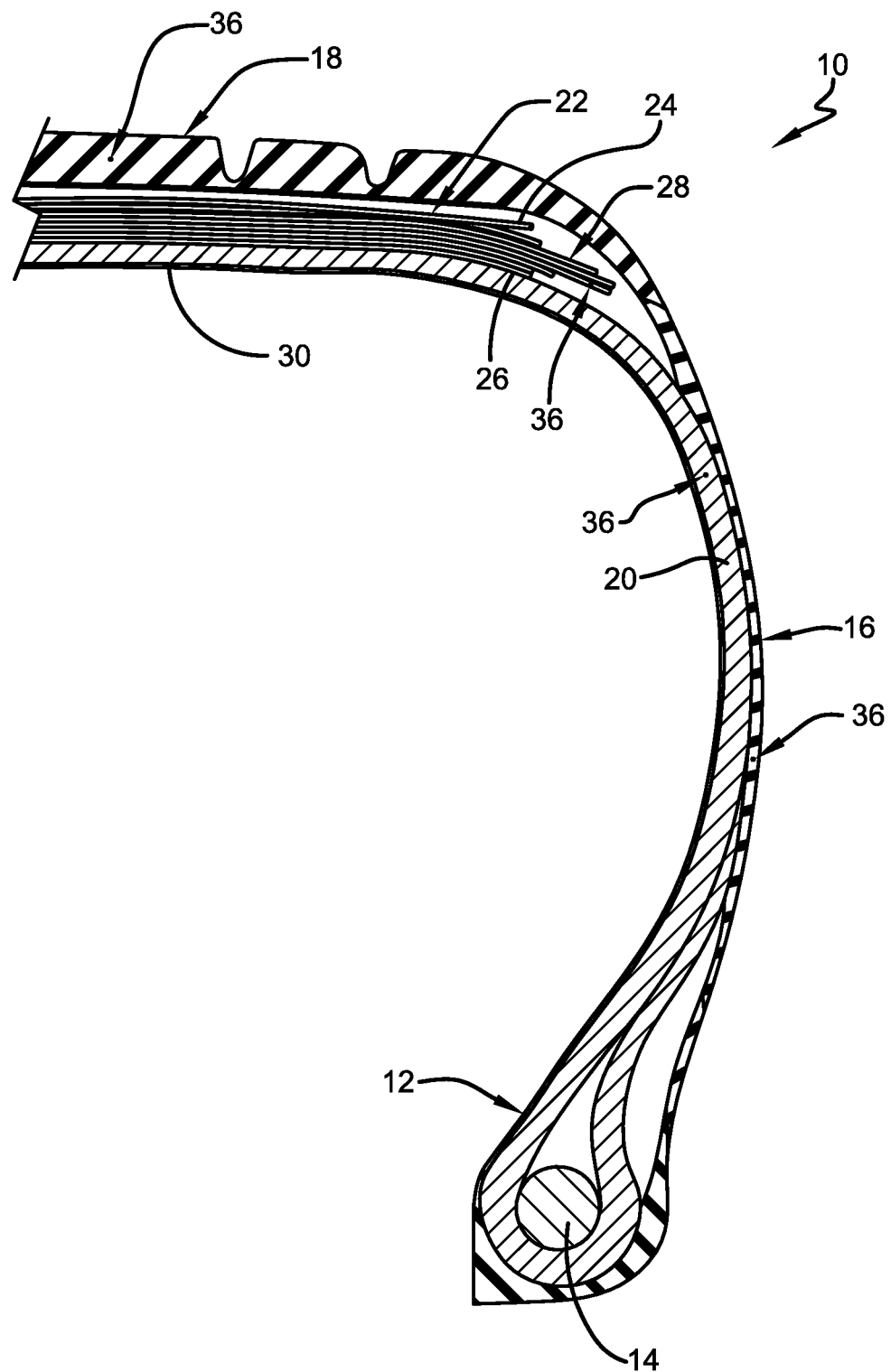
FIG. 1 is a schematic cross-sectional view of an exemplary article of the present invention.

An exemplary embodiment of an article of the present invention is indicated generally at 10, and is shown in FIG. 1. By way of example, the article 10 is shown and described herein as a tire 10, with the understanding that the invention applies to any article that experiences repeated deformation. The tire 10 includes a bead area 12 and a bead core 14 embedded in the bead area. A sidewall 16 extends radially outward from the bead area 12 to a ground-contacting tread 18. The tire 10 is reinforced by a carcass 20 that toroidally extends from one bead area 12 to a second bead area (not shown), as known to those skilled in the art. The carcass 20 includes at least one ply that preferably winds around each bead core 14.

A belt reinforcement package 22 is disposed between the carcass 20 and the tread 18. The belt reinforcement package 22 may employ specific configurations as desired. For example, the belt reinforcement package 22 may include at least one of a radially outer belt structure 24 and a radially inner belt structure 26, and an intermediate belt structure 28 disposed between the radially outer belt structure and the radially inner belt structure. In the prior art, an integrated circuit/sensor/antenna unit (not shown), which would be about 5 to 10 mm thick by about 20 to 25 mm in diameter, would be attached to an innerliner 30, which is the layer that forms the radial inside of the tire 10.

Figure 2:
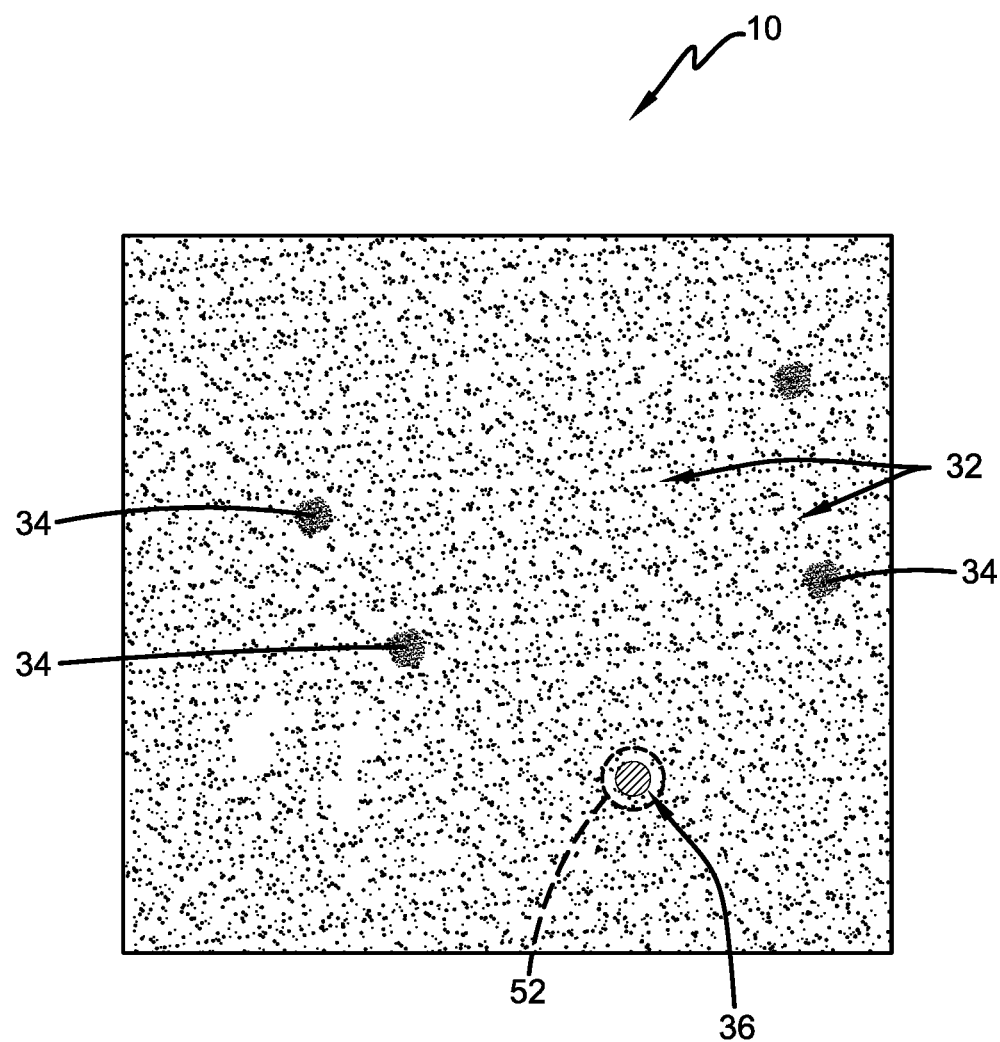
FIG. 2 is a representation of the microstructure of a vulcanized rubber compound of a structural component of the article shown in FIG. 1.

With additional reference to FIG. 2, the tread 18 of the tire 10 includes a material that in turn includes an elastomer compound 32 which may be reinforced with a predetermined amount of rigid particulate inclusions 34, such as carbon black and/or silica. The inclusions 34 are dispersed throughout the compound 32 and typically include a size of up to about 500 microns or about 0.5 millimeters (mm) in diameter.

In addition, the compound 32 may include a limited amount of other particulate inclusions (not shown), such as particles of dirt or sand. Those particulate inclusions may be up to about 2,000 microns or about 2 mm in diameter. While the size of such dirt or sand particulate inclusions may be larger than the particulate inclusions 34 of carbon black or silica, the amount of such inclusions is limited and the tire 10 is designed to account for a certain amount of them.

Therefore, the design of the tire 10 allows for a predetermined number or amount of inclusions 34 in the tread compound 32 that are up to about 0.5 mm in diameter, and for a limited number of inclusions that are up to about 2 mm in diameter. It is to be understood that the compound 32 of the tread 18 is shown and described by way of example, as the invention applies to any material or compound of a component or structure of the tire 10, including components of the sidewall 16, the carcass 20, the belt reinforcement package 22, the innerliner 30, and the like, as well as other articles that experience repeated deformation.

In accordance with a feature of the invention, the tire 10 includes an electronic component 36 that is incorporated into the material of the tire, such as compound 32, as an inclusion. It is to be understood that the term inclusion as used herein means a component that is integrated into a compound of a component of the tire 10 as a rigid particulate that is under 2 mm in diameter. For example, the electronic component 36 is as small as possible, and may be up to about 0.2 mm in diameter or about 0.5 mm in diameter, as forming techniques (to be described below) dictate. The maximum size of the rigid electronic component or components 36 in such a size preferably is no larger than inclusions already existing in the compound, and therefore will not reduce the resistance of the tire 10 to mechanical fatigue during repeated mechanical deformations.

In non-rubber articles that experience deformation, the size range may be different than that described above, with the understanding that the present invention is directed to a size of the electronic inclusion 36 being no greater than the largest inclusions or grain sizes that are usually present in the material of the articles. It is to be understood that the term "diameter" as used herein is by way of convenience, as the electronic inclusion may be of any geometric shape known to those skilled in the art, including any circle, sphere, polygon, polyhedron, and the like.

The electronic component 36 preferably is formed by micro-assembly techniques, such as three-dimensional (3D) printing. For example, micro-3D printing techniques have been developed that reduce the size of integrated circuits and other electronic components to a range of under 2 mm in diameter. Such techniques are described in greater detail in published International Application No. WO2016/144944, published International Application No. WO2016/145309 and published U.S. Application No. 2016/0290880, which are hereby incorporated by reference.

The electronic component 36 may be inserted into the compound 32 before curing of the tire 10 at a specific location in the tire, as will be described in greater detail below. Once the tire 10 is cured, the electronic component 36 is permanently disposed at its selected location inside the tire. Alternatively, the electronic component 36 may be inserted into the compound 32 after the tire 10 is cured and glued or secured in place by an adhesive or an interference fit. Moreover, the electronic component 36 may be employed in a new tire 10, or in a tire that is being retreaded.

For a retreaded tire, the electronic component 36 is inserted into the compound 32 of the new tread, which may be in a flat, circular or semi-circular configuration. The new tread is bonded to the carcass to form the retreaded tire, which includes the electronic component 36.

Figure 3:
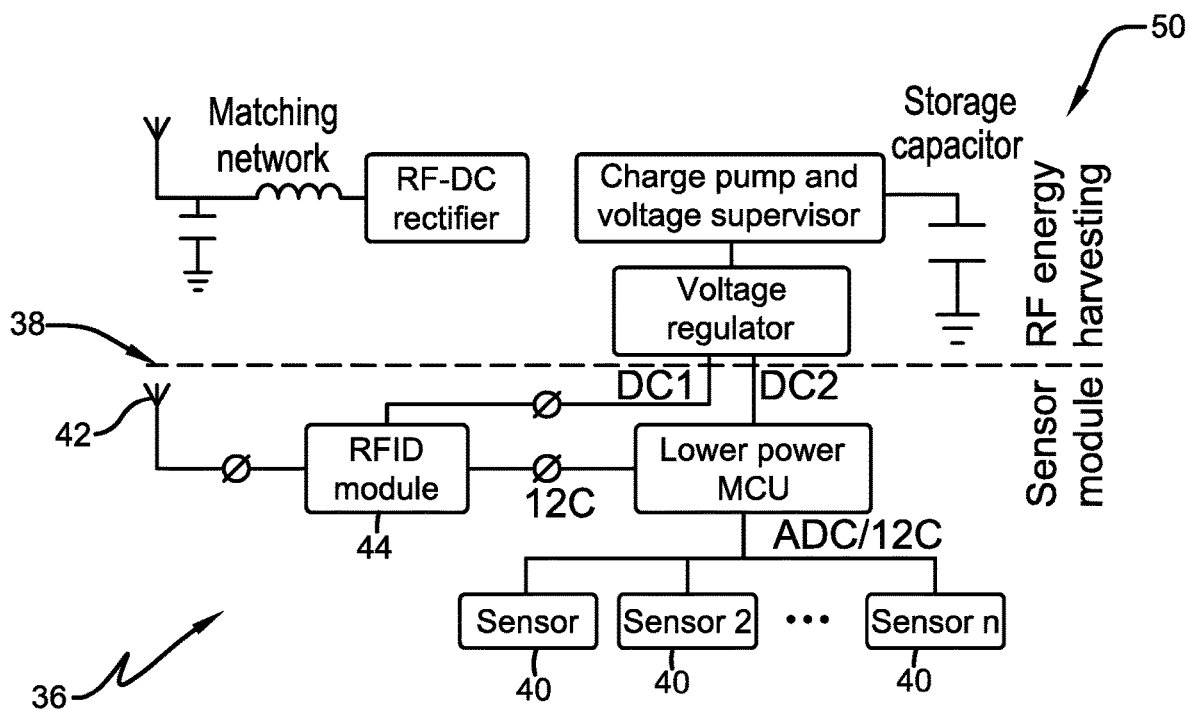
FIG. 3 is a circuit diagram of an exemplary electronic component incorporated into a compound of the article shown in FIG. 1.

With reference to FIG. 3, the electronic component 36 includes an integrated circuit 38 that processes and stores information. The electronic component 36 also includes at least one sensor 40 that is electronically connected to the integrated circuit 38, or is integrated into the integrated circuit. Of course, multiple sensors 40 may be electronically connected to the integrated circuit 38 or integrated into the integrated circuit. The electronic component 36 preferably includes an antenna 42 for receiving and transmitting a signal to an external reader, which will be described in greater detail below. The antenna 42 is also electronically connected to the integrated circuit 38, and may be carried on a substrate with the integrated circuit.

In this manner, the electronic component 36 includes an integrated circuit 38, at least one sensor 40 and an antenna 42 that are integrated with one another or otherwise electronically connected. The electronic component 36 may include a modular construction to enable easy electronic connection of multiple sensors 40 or other components. In addition, the electronic component 36 may include more than one integrated circuit 38. Because the tire 10 is designed to accommodate multiple particulate inclusions, multiple electronic components 36 may be incorporated into several locations in the tire. For example, a plurality of electronic components 36 may be incorporated into the tread compound 32 across the tread 18 and/or about the circumference of the tire 10.

As shown in FIG. 1, multiple electronic components 36 may be placed in desired locations as inclusions within the same tire 10 to create an array. For example, multiple electronic components 36 may be positioned circumferentially around the tire 10 at locations where stresses and heat are concentrated, such as both edges of a belt or both endings of a ply. The use of multiple electronic components 36 as an array of sensors is advantageous for structural health monitoring of the tire 10 because the temperature and stress typically are not uniform around the circumference of the belt edge or ply ending due to inevitable variations in thicknesses caused by splices and the like. Therefore, the health and/or conditions of the tire 10 typically are not uniform around the tire circumference, making it difficult to determine the location of the most adverse conditions in the tire. An array provided by multiple electronic components 36 would desirably be able to detect the point of the most adverse conditions in the tire 10. Data from each electronic component 36 in the array preferably is communicated wirelessly, as will be described in greater detail below.

The electronic component 36 provides a desired electronic function through the use of the sensor 40 and the integrated circuit 38, such as measuring temperature, pressure, wear, force, strain and/or acceleration of the tire 10. For example, the sensor 40 may include one or more of at least one sensor includes at least one of a temperature sensor, a pressure sensor, a wear sensor, a force sensor, a strain sensor and an acceleration sensor or accelerometer.

In addition, as shown in FIG. 3, the electronic component 36 may be configured to receive a radio frequency (RF) power signal and/or transmit an RF data signal using the antenna 42 and the integrated circuit 38. Preferably, the RF signal is an ultra high frequency (UHF) signal in a range of from about 300 megahertz (MHz) to about 3 gigahertz (GHz). Moreover, the integrated circuit 38 of the electronic component 36 may include a module 44 for storing information that identifies the tire 10 through tire type, manufacturing location and the like, and/or a unique identification code, such as a tire identification (ID) code as will be described in greater detail below. The electronic component 36 optionally includes a non-rechargeable battery, rechargeable battery, supercapacitor, energy harvesting structure or wireless power receiver 50 that is integrated with or coupled to the integrated circuit 38, as will be described in greater detail below.

Returning to FIG. 2, the electronic component 36 may optionally be encapsulated in a rubber compound 52 that is softer than the tire tread compound 32. For example, the encapsulation compound 52 may be a soft gum rubber. The electronic component 36 with encapsulation 52 may be inserted into the compound 32 of an uncured tire, which is then cured. Alternatively, for a tire 10 that has already been cured, a pocket may be formed in the cured compound 32, and the electronic component 36 with encapsulation 52 inserted into the pocket. The encapsulation compound 52 protects the electronic elements in the component 36 from the mechanical forces arising in the tire 10 during operation by transmitting less force than a denser or harder compound, such as the tread compound 32. In addition, the encapsulation compound 52 preferably is of a type that allows RF signals and/or wireless power signals as described above to pass through it, which enables efficient signal and/or energy transmission to and from the electronic component 36.

As shown in FIG. 1 and mentioned above, the electronic component 36 may be disposed at a particular location inside the tire 10 to detect specific information. For example, the electronic component 36 may be employed to detect the temperature profiles within the tire 10 during curing. In such a case, the electronic component 36 may be disposed in the last part of the tire 10 to cure, which is referred to as the point of least cure. By being located at the point of least cure in the tire 10, the electronic component 36 measures the actual integrated time and temperature history during the curing of the tire, which may be used to control the cycle time of the curing press. Such a measurement of actual temperature at the point of least cure of the tire 10 by the electronic component 36 is more reliable than prediction techniques. In addition, because prediction techniques often add more curing time as a precautionary factor, measurement of actual temperature may reduce the curing time that is required for the tire 10, thereby increasing the efficiency of the curing process.

The electronic component 36 may also be employed to detect temperature within the tire 10 during its use on a vehicle. For example, the electronic component 36 may be disposed at the edge of the intermediate belts 28 in the belt reinforcement package 22 to measure the belt edge temperature. Belt edge temperature is an indicator of performance and/or life issues for the tire 10, and by detecting temperature in the compound at the belt edge, the electronic component 36 provides data indicating when tire replacement is recommended. The electronic component 36 may also track a temperature versus time history at a specific location, such as the belt edge or a belt splice, in order to provide data to predict when tire replacement should occur. Moreover, the electronic component 36 may be disposed in a lower area of the tire sidewall 16, at the bead area 12 and/or near the bead core 14 for temperature monitoring at a flange of a rim to which the tire 10 is mounted.

In addition, the electronic component 36 may be employed to detect wear of the tire 10 during its use on a vehicle. For example, the electronic component 36 may be disposed in the compound 32 of the tread 18 at a specific distance from the radially outer surface of the tread. By measuring changes in electrical resistance, temperature and/or pressure, the electronic component 36 provides data indicating the amount of wear of the tread 18 of the tire 10. Such data may be used to indicate when replacement of the tire 10 is recommended.

Moreover, the electronic component 36 may include a strain and force indicator for the tire 10 during its use on a vehicle. For example, the electronic component 36 may be disposed in the compound 32 of the tread 18 and/or in the compound of the sidewall 16. By measuring the strain in the tread 18 of the tire 10, the electronic component 36 may provide data indicating road conditions, and by measuring the strain in the sidewall 16 of the tire, the electronic component may provide data indicating the load on the tire. This data can be communicated to the vehicle stability and/or braking systems to provide improved control of the vehicle, and can also be used for monitoring or tracking driving behavior.

As mentioned above, the integrated circuit 38 of the electronic component 36 may include identification (ID) information for the tire 10. The tire ID information may include manufacturing information for the tire 10, such as: the tire type; tire model; size information, such as rim size, width, and outer diameter; manufacturing location; manufacturing date; a treadcap code that includes or correlates to a compound identification; and a mold code that includes or correlates to a tread structure identification. The tire ID information may also include a service history or other information to identify specific features and parameters of each tire 10, as well as mechanical characteristics of the tire, such as cornering parameters, spring rate, load-inflation relationship, and the like. Such tire identification enables correlation of any of the above data with the specific tire 10 to provide local or central tracking of the tire, its current condition, and/or its condition over time. For example, Global positioning system (GPS) capability may be included to provide location tracking of the tire 10 during transport and/or location tracking of the vehicle on which the tire is installed.

Figure 4:
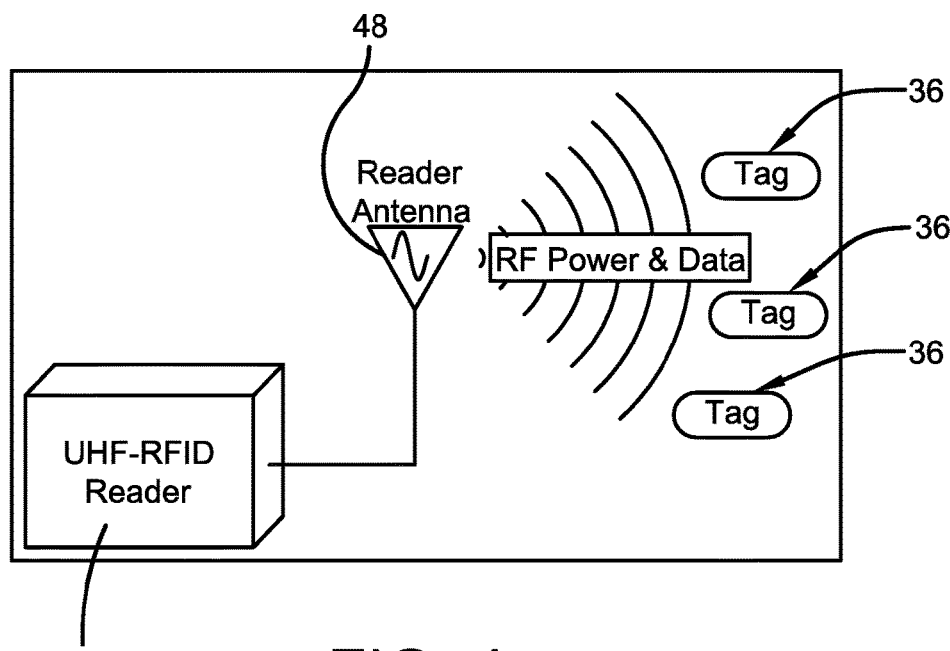
FIG. 4 is a schematic representation of a reader and the exemplary electronic component shown in FIG. 3.

Referring now to FIGS. 3 and 4, the electronic component 36 preferably is a passive RF component that is actuated by an external reader 46. More particularly, the electronic component 36, including the integrated circuit 38 and the sensor 40, remain in a passive state. When the reader 46 and is placed in proximity with the electronic component 36, the antenna 42 receives a wireless signal from the reader through a reader antenna 48 that actuates the integrated circuit 38. The sensor 40 takes its respective measurements, and data from the sensor measurements is communicated to the integrated circuit 38. The data is stored on the integrated circuit 38 and transmitted wirelessly by the antenna 42 from the electronic component 36 to the reader antenna 48 and the reader 46.

After the reader 46 is removed from proximity with the electronic component 36, the electronic component preferably returns to its passive state. Each time that the reader 46 is placed into proximity with the electronic component 36, the electronic component is actuated as described above. In this manner, multiple sensor measurements may be taken and stored without an ongoing power requirement by the electronic component 36. Optionally, the electronic component 36 may include a micro-battery or an energy harvester 50 to extend the transmission range of the electronic component and/or to periodically actuate the electronic component to contact the reader 46.

The reader 46 may be a hand-held unit or a unit that is attached to a structure in proximity with the electronic component 36. For example, when the electronic component 36 is used to detect parameters of the tire 10 during operation of a vehicle, the reader 46 may be attached to the vehicle, including the vehicle body or a hub of a rim to which the tire is mounted. When the electronic component 36 is used to detect parameters of the tire 10 during curing, the reader may be attached on or in a center mechanism of a tire curing press. Once the data is received by the reader 46, the reader may transmit it to the vehicle control system and/or to a device for analysis of the data. For example, the reader 46 may transmit the data to a central server for analysis, or to the cell phone of a user or technician for review.

In this manner, an article 10 such as a tire includes the electronic component 36 as a rigid electronic inclusion that is no larger than the largest particulate inclusions already present in typical tire rubber compounds. By being incorporated as an inclusion into a compound of a structure of the tire 10 at such a size, the electronic component 36 provides useful data about the tire while not adversely affecting the performance of the tire, including resistance of the compound to fatigue.

The present invention also includes a method of forming an article 10 with an electronic component 36 as an inclusion. The method includes steps in accordance with the description that is presented above and shown in FIGS. 1 through 4.

Reference herein has been made to a tire 10 by way of example, with the understanding that the invention applies to any article that experiences repeated deformation. For example, the invention applies to any type of tires, including pneumatic tires, non-pneumatic tires, automotive tires, passenger tires, truck tires, commercial tires, off-the-road tires, aircraft tires, spacecraft tires, and the like, as well as to buildings, bridges, shoe soles, medical devices, rubber engineered products such as air springs and vibration mounts, bearings, sealants, adhesives, and the like.

It is also to be understood that the structure of the above-described tire 10 and/or the electronic component 36 may be altered or rearranged, or components or steps known to those skilled in the art omitted or added, without affecting the overall concept or operation of the invention. For example, the electronic component 36 may be disposed in any location in the tire 10 as an inclusion, any number of electronic components may be disposed in the tire 10 as inclusions, and other electronic structures may be connected to or integrated into the electronic component.

The invention has been described with reference to a preferred embodiment. Potential modifications and alterations will occur to others upon a reading and understanding of this description. It is to be understood that all such modifications and alterations are included in the scope of the invention as set forth in the appended claims, or the equivalents thereof.

What is claimed is:

1. An article with an electronic component inclusion, comprising:
    at least one structural element, the structural element including a first material;
    at least one electronic component being incorporated into the first material as an inclusion;
    an integrated circuit being included in the electronic component; and a second material encapsulating the electronic component, the second material being softer than the first material and being inserted into a compound of the first material.

2. The article with an electronic component inclusion of claim 1, wherein the electronic component is up to about 2 millimeters in diameter.

3. The article with an electronic component inclusion of claim 2, wherein the electronic component is up to about 0.5 millimeters in diameter.

4. The article with an electronic component inclusion of claim 1, wherein the electronic component is formed by a micro-assembly technique.

5. The article with an electronic component inclusion of claim 1, wherein the electronic component includes at least one sensor in electronic communication with the integrated circuit.

6. The article with an electronic component inclusion of claim 5, wherein the wherein the at least one sensor includes at least one of a temperature sensor, a pressure sensor, a wear sensor, a force sensor, a strain sensor and an acceleration sensor.

7. The article with an electronic component inclusion of claim 5, wherein the electronic component includes a modular construction with multiple sensors.

8. The article with an electronic component inclusion of claim 1, wherein the electronic component includes an antenna in electronic communication with the integrated circuit.

9. The article with an electronic component inclusion of claim 1, wherein the at least one electronic component includes multiple electronic components that are electrically interconnected.

10. The article with an electronic component inclusion of claim 1, wherein the article includes a plurality of materials, and at least one electronic component is incorporated into a respective one of the materials as an inclusion.

11. The article with an electronic component inclusion of claim 1, wherein the electronic component includes at least one of a battery, a supercapacitor, an energy harvesting structure and a wireless power receiver.

12. The article with an electronic component inclusion of claim 1, wherein the electronic component is a passive radio frequency unit that is actuated by an external reader.

13. The article with an electronic component inclusion of claim 1, wherein the article is a tire, the tire comprising:
a pair of bead areas;
a sidewall extending from each respective bead area to a tread, the sidewall including a compound and the tread including a tread compound;
a carcass extending toroidally between each of the bead areas, the carcass including a carcass compound; and
a belt reinforcement package disposed between the tread and the carcass, the belt reinforcing package including a belt compound; and
wherein the at least one electronic component is incorporated into at least one of the tread, carcass and belt compounds as an inclusion.

14. The article with an electronic component inclusion of claim 13, wherein the integrated circuit includes information for identification of the tire.

15. The article with an electronic component inclusion of claim 13, wherein the at least one of the compounds includes a plurality of electronic components incorporated into the at least one of the tread, carcass and belt compounds as inclusions.

16. The article with an electronic component inclusion of claim 13, wherein the electronic component is inserted into the at least one of the tread, carcass and belt compounds before curing of the tire.

17. The article with an electronic component inclusion of claim 16, wherein the electronic component is disposed at a point of least cure in the tire.

18. The article with an electronic component inclusion of claim 13, wherein the electronic component is inserted into the at least one of the tread, carcass and belt compounds after curing of the tire.

19. The article with an electronic component inclusion of claim 13, wherein the at least one electronic component includes a plurality of electronic components incorporated into at least one of the tread, carcass and belt compounds as a respective plurality of inclusions.

* * * * *